United States Patent [19]

Swanson

[11] Patent Number: 4,949,050
[45] Date of Patent: Aug. 14, 1990

[54] RF POWER AMPLIFIER SYSTEM HAVING AMPLIFIER PROTECTION

[75] Inventor: Hilmer I. Swanson, Quincy, Ill.

[73] Assignee: Harris Corporation, Melbourne, Fla.

[21] Appl. No.: 404,461

[22] Filed: Sep. 12, 1989

[51] Int. Cl.$^5$ .......................... H02H 7/20; H03F 3/26
[52] U.S. Cl. .................................. 330/298; 330/146; 330/207 P
[58] Field of Search ...................... 330/51, 146, 207 P, 330/277, 296, 298; 455/117

[56] References Cited

U.S. PATENT DOCUMENTS 4,092,610   5/1978   White et al. .................... 330/146 X Primary Examiner—Steven Mottola
Attorney, Agent, or Firm—Tarolli, Sundheim & Covell

[57] ABSTRACT

An RF power amplifier having improved amplifier protection. An RF source provides an RF signal to be amplified. The amplifier includes a bridge circuit having an input circuit adapted for connection across a DC voltage source and an output circuit connected across a load. The bridge circuit includes first and second transistors for, when on, connecting the DC voltage source across the load for DC current flow therethrough in a first direction and third and fourth transistors for, when on, connecting the DC voltage source across the load for DC current flow therethrough in a second direction. The transistors are controlled in response to the RF signal so that they turn on and off at a frequency dependent upon that of the RF signal and such that current flows from the DC source alternately in the first and second directions through the load. An amplifier control serves to apply a reverse bias to the second and fourth transistors to prevent them from conducting current until receipt of a turn on signal. The turn on signal is provided for actuating the amplifier controller to remove the reverse bias from the second and fourth transistors such that the reverse bias applied to the fourth transistor is removed during a first half cycle of the RF signal when the fourth transistor is off and that the reverse bias applied to the second transistor is removed during a succeeding half cycle when the second transistor is off.

15 Claims, 2 Drawing Sheets

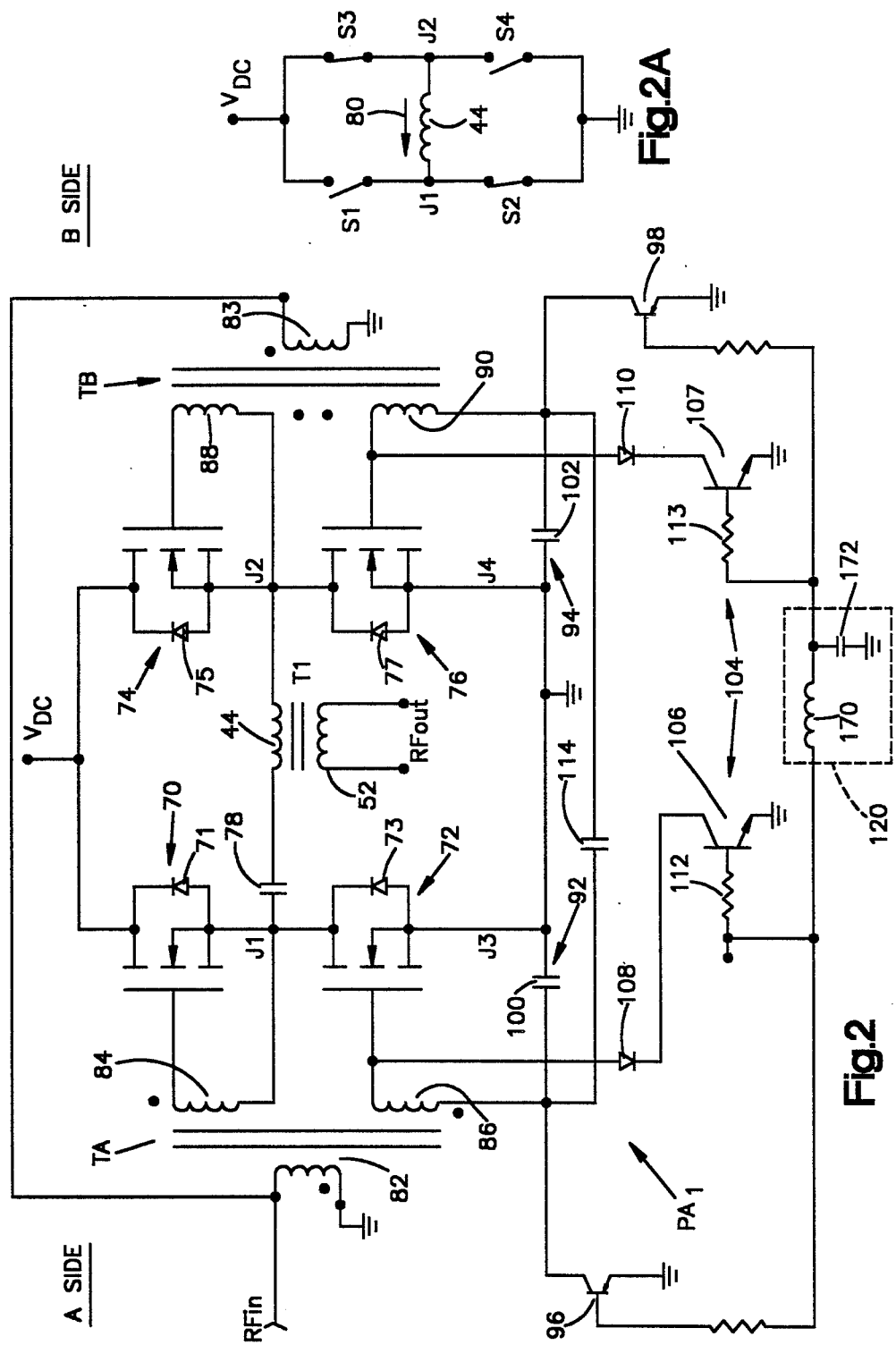

RF POWER AMPLIFIER SYSTEM HAVING AMPLIFIER PROTECTION

BACKGROUND AND FIELD OF THE INVENTION

The present invention relates to the art of protection circuitry for a power amplifier and, more particularly, for RF power amplifiers of the type employed in AM radio broadcasting.

The U.S. Pat. to H. I. Swanson, No. 4,580,111, discloses an amplitude modulator which generates an amplitude modulated carrier signal by selectively turning on and off a plurality of RF amplifiers in a digital manner to produce amplitude modulation. Each of the RF amplifiers includes a plurality of switching transistors, each of which may take the form of a MOSFET transistor, connected together in a bridge circuit. The output terminals of each bridge circuit are connected across a primary winding of a transformer having a secondary winding. The secondary windings of all of the power amplifiers are connected together in series for combining the amplified RF signals with the combined RF signal being supplied to a load, such as an antenna. If one or more of the power amplifiers is on and delivering power to the load, the other amplifiers that are not on will have the same current flowing in their secondary windings and this is reflected in the primary windings. The bottom transistors of such a bridge arrangement are reversed biased until it is decided to turn on the RF power amplifier. However, even though the bottom transistors are reverse biased, current will flow in the top transistors as a result of the current flowing in the primary winding. The top transistors will provide a low impedance path for this current flow in both directions. Thus, for current flow in one direction, the impedance is low because the transistor gate is turned positive during this time. A current path for the other direction of current flow is provided by the MOSFET body drain diode. If the bottom transistors are turned on by removing the reverse bias during the time that current is flowing in the body drain diode of the associated top transistor, a large stress will be generated in the top transistor by forcing its body drain diode to recover very rapidly. Also, high peak current will flow in the bottom transistor. Most MOSFETS will fail under this type of stress.

It has been known in the prior art that failure of such transistors may be avoided by carefully adjusting the timing at which the reverse bias is removed to turn on the lower transistors such that this takes place at exactly the zero crossing of the RF signal supplied to the bridge circuit. However, if the turn on is too early, the transistors in one half of the bridge amplifier will be stressed. If the timing is too late, the transistors in the other half of the bridge amplifier will be stressed.

SUMMARY OF THE INVENTION

It is an object of the present invention to prevent such RF power amplifier failure by turning on the bottom transistor on one side of the bridge amplifier at or before the zero crossing while delaying the turn on of the bottom transistor on the other side of the bridge amplifier until after the zero crossing has taken place.

In accordance with the present invention, there is provided an RF power amplifier having improved amplifier protection. An RF source provides an RF signal to be amplified. The amplifier includes a bridge circuit having an input circuit adapted for connection across a DC voltage source and an output circuit connected across a load. The bridge circuit includes first and second transistors for, when on, connecting the DC voltage source across the load for DC current flow therethrough in a first direction and third and fourth transistors for, when on, connecting the DC voltage source across the load for DC current flow therethrough in a second direction. The transistors are controlled in response to the RF signal so that they turn on and off at a frequency dependent upon that of the RF signal and in such a manner that current flows from the DC source alternately in the first and second directions through the load. An amplifier control serves to apply a reverse bias to the second and fourth transistors to prevent them from conducting current until receipt of a turn on signal. The turn on signal is provided for actuating the amplifier controller to remove the reverse bias from the second and fourth transistors such that the reverse bias applied to the fourth transistor is removed during a first half cycle of the RF signal when the fourth transistor is off and that the reverse bias applied to the second transistor is removed during a succeeding half cycle of the RF signal when the second transistor is off.

BRIEF DESCRIPTION OF THE DRAWINGS

The foregoing and other objects and advantages of the present invention will become more readily apparent from the following detailed description as taken in conjunction with the accompanying drawings, wherein:

FIG. 2 is a schematic circuit illustration of one of the power amplifiers employed in FIG. 1; and FIG. 2A is a simplified schematic circuit useful in understanding the operation of the circuit shown in FIG. 2.

DESCRIPTION OF A PREFERRED EMBODIMENT

Figure 1:
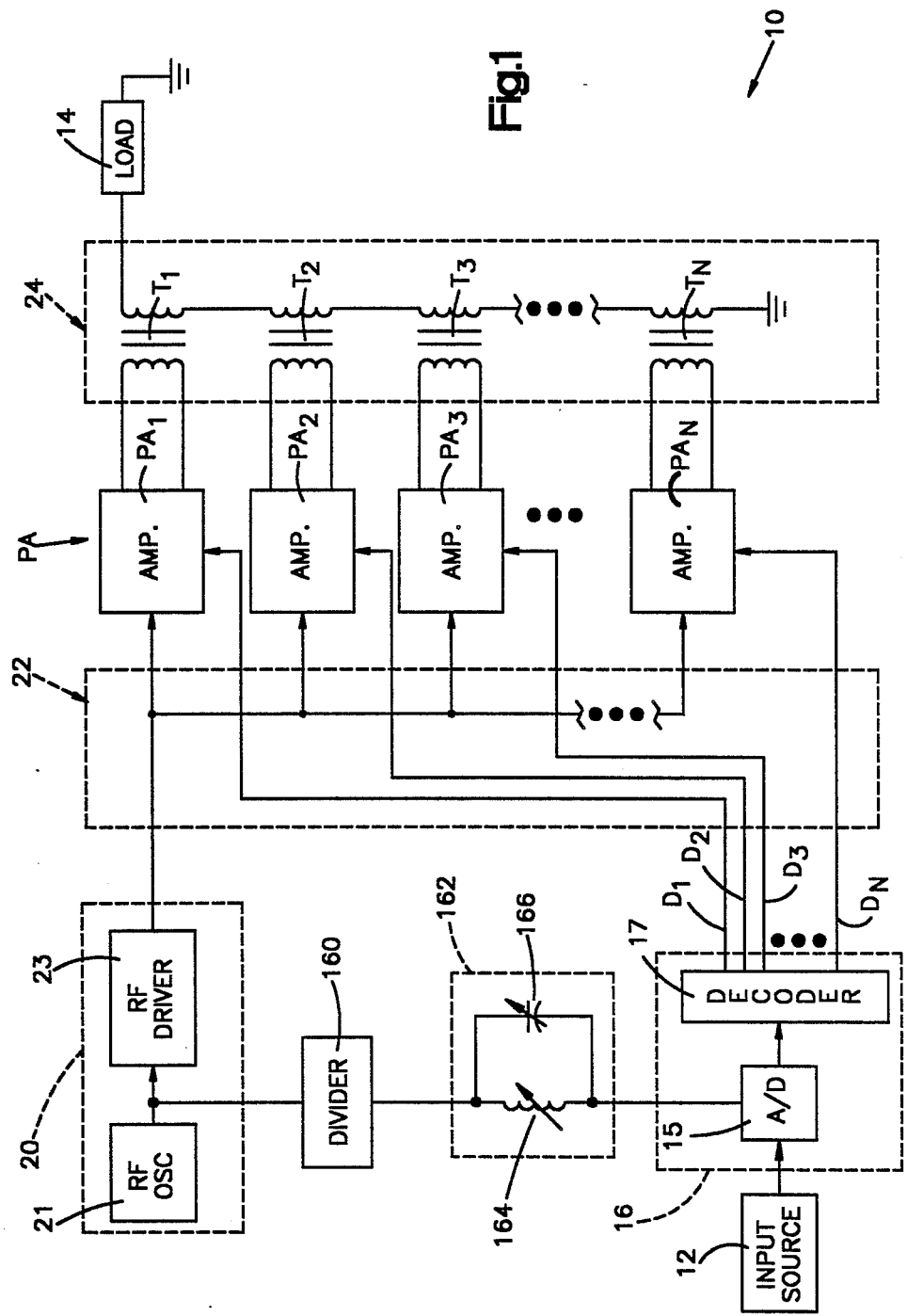
FIG. 1 is a schematic-block diagram of one application to which the present invention may be applied.

One application of the present invention is in conjunction with protecting RF power amplifiers employed in an AM broadcast transmitter. An example of such a transmitter is presented in FIG. 1 and takes the form of a digital amplitude modulator such as that illustrated and described in my aforesaid U.S. Pat. No. 4,580,111, which is assigned to the same assignee as the present invention, the disclosure of which is herein incorporated by reference. The discussion which follows is directed to an explanation of the operation of the circuitry shown in FIG. 1 followed by a detailed description of a power amplifier as illustrated in FIGS. 2 and 2A herein as background for the discussion of the phase amplitude compensation circuitry of the present invention and which is incorporated in FIGS. 1 and 2.

Referring now to FIG. 1, the amplitude modulator 10 is illustrated as receiving an input signal from input source 12 which may be the source of an audio signal. Modulator 10 generates an RF carrier signal which is amplitude modulated as a function of the amplitude of the input signal from source 12. The amplitude modulated carrier signal is supplied to a load 14, which may take the form of an RF transmitting antenna.

A digitizer 16 provides a plurality of digital control signals D1 through DN which have values which vary in accordance with the instantaneous level of the input signal. The control signals are binary signals each having a binary 1 or a binary 0 level. The number of signals having binary 1 or binary 0 levels is dependent upon the instantaneous level of the input signal.

Each of the output control signals D1-DN is supplied to one of a plurality of N RF power amplifiers $PA_1$–$PA_N$. The control signals serve to turn associated power amplifiers either on or off. Thus, if the control signal has a binary 1 level, then its associated amplifier is inactive and no signal is provided at its output. However, if the control signal is of a binary 0 level, then the power amplifier is active and an amplified carrier signal is provided at its output. Each power amplifier has an input connected to a single common RF source 20. The RF source 20 serves as the single source of an RF carrier signal which is supplied by way of an RF splitter 22 so that each amplifier $PA_1$–$PA_N$ receives a signal of like amplitude and phase and frequency. The carrier signal is amplitude modulated in accordance with the control signals D1-DN and the amplitude modulated carrier signals will be of like frequency and phase. These signals are supplied to a combiner circuit 24 comprised of a plurality of transformers $T_1, T_2, T_3, \ldots, T_N$. The secondary windings act as an independent signal source, whereby the signals provided by the various transformers additively combine with one another to produce a combined signal which is supplied to the load 14. This combined signal has the same frequency as the RF signal supplied by the RF source 20, but the amplitude of the combined signal is modulated in accordance with the input signal supplied by the input source 12.

As is conventional in such a system, the RF source 20 includes an RF oscillator 21 having a frequency on the order of 500 to 1600 KHz. This oscillator feeds an RF driver 23, the output of which is supplied to the power amplifiers $PA_1$–$PA_N$. The RF driver provides power amplification of the RF signal obtained from oscillator 21 prior to the signal being supplied to the power amplifiers at which modulation also takes place. The RF driver 23 may include several stages of amplification and may be configured similar to the power amplifiers $PA_1$–$PA_N$.

FIG. 2 illustrates one form which the power amplifier $PA_1$ of FIG. 1 may take, the other power amplifiers $PA_2$–$PA_N$ being similar. The power amplifier illustrated includes four semiconductor amplifier elements 70, 72, 74 and 76 connected in a bridge arrangement across a DC power supply voltage of, for example, 250 volts. The primary winding 44 of the associated transformer $T_1$ is connected across the bridge junctions $J_1$ and $J_2$ of the four semiconductor amplifier elements.

More particularly, the semiconductor amplifier elements are metal oxide semiconductor, field effect transistors (MOSFETs') having three electrodes, conventionally identified as the gate, drain, and source. The drain-source paths of the transistors 70 and 72, representing their primary current paths, are connected in series across the DC power supply, as are the drain-source current paths of transistors 74 and 76. The body drain diodes of these transistors are illustrated as diodes 71, 73, 75 and 77. The primary winding 44 of the corresponding combiner transformer T1 is connected in series with a DC blocking capacitor 78 across the common junctions $J_1$ and $J_2$ between transistors 70 and 72 and transistors 74 and 76.

The transistors 70, 72, 74 and 76 effectively operate as switches to connect the two sides of the primary winding 44 to either the DC voltage source or to ground. By proper operation of these transistors, the transformer winding 44 can be connected in either direction across the DC power supply.

This can perhaps be more readily understood by reference to FIG. 2A, which is a simplified illustration of the FIG. 2 circuitry. In FIG. 2A the transistors 70, 72, 74 and 76 are respectively characterized by conventional single pole, single throw switches $S_1$, $S_2$, $S_3$ and $S_4$. As shown in FIG. 2A, the switch $S_1$ is open and the switch $S_2$ is closed, whereby the common junction $J_1$ between them is grounded. The switch $S_3$ is closed and the switch $S_4$ open, however, whereby the junction $J_2$ between those switches is connected to the DC supply voltage. Current will therefore pass through the primary winding 44 in the direction indicated by the arrow 80.

When all four switches $S_1$–$S_4$ are thrown to their opposite states, current will pass through the output winding 44 in the opposite direction. Thus, when switches $S_1$ and $S_4$ are closed and switches $S_2$ and $S_3$ opened, junction $J_1$ is connected to the DC supply and junction $J_2$ is connected to ground. In this case the current through the primary winding 44 of the transformer is in a direction opposite to that indicated by arrow 80 of FIG. 2A. An AC signal can thus be applied across the coil 44 by cyclically switching the switches $S_1$–$S_4$ between these two alternate states. If this is done at RF frequencies, then an RF carrier signal results.

Referring back to FIG. 2, the transistor switches 70, 72, 74 and 76 are controlled by signals applied to their gate electrodes. The gate signals for all four transistors are derived from individual secondary windings of a pair of transformers $T_A$ and $T_B$. The transformers each have a toroidal ferrite core. Primary windings 82 and 83 and four secondary windings 84, 86, 88 and 90 are wound around the cores. The turns ratio of each transformer is 1:1, whereby the same signal appearing at each primary is applied to each of the circuits connected to the four secondary windings.

Each of the four secondary windings is connected between the gate and source electrodes of an associated one of the MOSFETs 70-76. The secondary 84 is directly connected between the gate of MOSFET 70 and junction $J_1$, while secondary 88 is similarly directly connected between the gate of MOSFET 74 and junction $J_2$. The secondary windings 86 and 90 are in like manner connected between the gate and source electrodes of MOSFETs 72 and 76, however in these cases impedance networks 92 and 94 are connected in series with the coils 86 and 90, respectively. Each impedance network 92, 94 includes a parallel combination of a transistor 96, 98 and capacitor 100, 102. The purpose of these impedance networks will be described hereinafter during the description of the amplifier control circuitry 104.

The primary winding of each toroidal transformer is connected to the output of the RF source 20, which provides a sinusoidal RF driving voltage to the power amplifier. Each MOSFET turns "on" when the RF signal applied to its gate is on its positive half cycle and "off" when the applied signal is on its negative half cycle. The MOSFETs therefore cyclically turn on and off at a frequency and phase of the applied RF gate signal. The windings 84 and 90 are connected across MOSFETs 70 and 76 in similar directions whereby the signals appearing at the gates of these transistors are in phase with one another. MOSFETs 70 and 76 therefore turn on and off in unison. Windings 86 and 88, on the other hand, are connected across MOSFETs 72 and 74 in a direction opposite to the direction of connection of windings 84 and 90. The signals applied to the gates of MOSFETs 70 and 76 are therefore 180 degrees out of phase with respect to the signals applied to the gates of transistors 74 and 72. Consequently, when transistors 70 and 76 are "on", transistors 72 and 74 are "off", and vice versa.

Due to the nonlinear transfer characteristics of the MOSFETs 70, 72, 74 and 76, the MOSFETs will abruptly turn on and off in response to the applied sinusoidal signal, rather than linearly following it. The signal applied across the junctions $J_1$ and $J_2$ will therefore have essentially a squarewave form, though at the frequency of the applied RF input signal. The load 14 to which the output of the combiner circuit 24 of FIG. 1 is connected will generally be frequency selective, and will select only the fundamental component of this squarewave.

As shown in FIG. 2, the power amplifier $PA_1$ includes a switching circuit 104 for turning the power amplifier on and off in response to a control signal appearing on the digitizer output line $D_1$. The switching circuit 104 includes a pair of NPN bipolar junction transistors 106 and 107 each having its emitter grounded. The collector of transistor 106 is connected to the gate of MOSFET 72 by way of a diode 108. Similarly, the collector of transistor 107 is connected to the gate of MOSFET 76 through a diode 110. The base of transistor 106 is connected to the $D_1$ output of the digitizer 24 through a base resistor 112. The base of transistor 107 is also connected to the $D_1$ output by way of a delay circuit 120, to be described hereinafter, and a base resistor 113.

When the control signal applied to the base resistor 112 has a high logic level (i.e., logic "1"), base current is applied to the transistor 106, forcing it into saturation. Similarly, when the control signal applied to the base resistor 113 has a high logic level, base current is applied to the transistor 107, forcing it into saturation. With both transistors 106 and 107 forced into saturation, the gates of transistors 72 and 76 are then effectively grounded through the corresponding diodes 108 and 110. This has the effect of clamping the gate signals of these transistors to a ground potential, thereby forcing both of them to remain in an "off" condition. The primary winding 44 is thus effectively disconnected from ground, thereby turning off the power amplifier. When the control signal $D_1$ applied to the transistors 106 and 107 is of a low logic level (i.e., logic "0"), however, the transistors 106 and 107 are cut off and the operation of the amplifier 26 is substantially as described previously.

The transistors 96 and 98 serve to rapidly to discharge capacitors 100 and 102 during the operation. Capacitor 114 is connected between both capacitors 100 and 102 and it serves to improve the turn on-turn off characteristics of the amplifier.

From the discussion given thus far with reference to FIGS. 1 and 2, it is seen that the power amplifier section PA includes several power amplifiers $PA_1$ through $PA_N$ which are turned on and off in a digital manner under the control of the digitizer to produce amplitude modulation. The drive for all of the amplifiers $PA_1$ through $PA_N$ is from a common RF driver 23 located within the RF source 20. The RF driver receives a radio frequency signal from an RF oscillator 21 operating at a relatively high RF frequency. The digitizer 16 includes an analog-to-digital converter 15 which receives the audio input signal from the input source 12 and converts it to a digital representation thereof and which is then decoded as with a decoder 17. As discussed previously, the number of control signals $D_1-D_N$ that are supplied will vary with the magnitude of the audio signal received from the source 12.

The analog-to-digital converter 15 converts the input from source 12 at a rate dependent upon the frequency of clock pulses supplied to the analog-to-digital converter from the RF oscillator 21. This rate may, for example, be on the order of 400 kHz if that is the frequency of the oscillator or a multiple thereof. Consequently, a divider 160 is interposed between the oscillator and the analog-to-digital converter to either provide pulses at the identical rate to that of the oscillator or at a rate one-half that of the oscillator, etc. A phase control circuit 162 comprised of an adjustable inductor 164 and an adjustable capacitor 166 is also located in this path for, in accordance with the present invention, adjusting the phase of the control signals $D_1$ through $D_N$ relative to that of the RF drive signal. Specifically, the phase adjustment is such that a control signal such as signal $D_1$, occurs at a point in time prior to the zero crossing of the RF drive signal, as will be explained in greater detail hereinafter.

In accordance with the present invention, circuitry is provided for protecting the RF power amplifiers $PA_1$ through $PA_N$. Specifically, the MOSFET transistors employed in such a power amplifier, as illustrated in FIG. 2, may fail if their peak forward current is too high, or the reverse recovery current of the body drain diode is too high. In the absence of the protection circuitry provided by the present invention, these MOSFET transistors may fail under certain operating conditions.

For example, reference should now be made to FIG. 2 from which it will be noted that the output of the power amplifier connects to a transformer $T_1$ having a secondary winding 52. From FIG. 1, it will be noted that the secondary windings 52 of all of the transformers $T_1$ through $T_N$ are connected together in series with a load 14. This will cause all of the power amplifiers to have identical current flowing in their primary winding 44. That is, if at least one of the power amplifiers is turned on and delivering power to the load 14, the other amplifiers that are not on will have the same current flowing in their secondary windings. Referring to FIG. 2, it will be noted that the top transistors 70 and 74 provide a path for the current flowing in transformer winding 44 when the bottom transistors 72 and 76 are turned off (and, hence, the power amplifier is turned off). These top transistors 70 and 74 provide a low impedance path in both directions. Thus, when the gate of transistor 70 is driven positive during the positive half cycle of the RF drive cycle, the transistor presents a low impedance for current to flow in a first direction. During the negative half cycle of the RF drive signal to transistor 70, current can flow in the other direction through the path provided by the MOSFET body drain diode 71. However, if during this negative half cycle of the RF drive signal the bottom transistor 72 is turned on by the digital control signal $D_1$, then this will take place during the period that current is flowing in the body drain diode 71. This will cause a large stress to be generated in the top transistor 70 by forcing its body drain diode to recover very rapidly. Also, in this condition, a high peak current will flow in the bottom transistor 72. This level of stress is sufficient that many MOSFETS will fail. The prior art attempts to avoid this problem take the place of attempting to adjust the timing of the digital turn on signal $D_1$ so as to take place at exactly the zero crossing of the RF drive signal. However, if the turn on signal was too early, the transistor in one half of the amplifier, such as side A, would be stressed. If the turn on signal was too late, transistors in the other half of the amplifier, such as side B, would be stressed.

In accordance with the present invention, circuitry is provided so that the turn on signal is adjusted so that side A turns on first, preferably prior to or no later than the zero crossing of the RF drive signal. The turn on signal for side B is delayed so that it does not turn on until after the zero crossing of the RF drive signal, at which point the RF voltage on the gate of transistor 76 is negative.

Referring now to the drawings, the improved circuitry includes the adjustable time delay circuit 162 illustrated in FIG. 1 which incorporates an adjustable LC circuit including inductor 164 and capacitor 166. These are adjusted so that the turn on signal, such as signal $D_1$, takes place before but no later than the zero crossing of the RF signal. At this point in time, the RF voltage to the gate of transistor 72 is negative and therefore will not conduct even though the turn on signal is present. The turn on signal takes the form of a negative-going signal which is supplied to the base of transistor 106 through base drive resistor 112 causing the transistor to be turned off thereby removing the reverse bias ground condition supplied to the gate of transistor 72. Consequently, as the RF voltage to the gate of transistor 72 becomes positive, the transistor will conduct in a manner as described hereinbefore. The turn on signal supplied to the base of the transistor 106 is also supplied to the base of transistor 107 by way of the delay circuit 120 (FIG. 2). This delay circuit includes an inductor 170 and a capacitor 172 which serves to delay the turn on signal by an amount sufficient for the gate voltage on transistor 76 to go negative. Thus, the delay may be such that transistor 106 is turned off during a first half cycle of the RF signal when the gate voltage to transistor 72 is negative and then transistor 107 is turned off in the next half cycle when the gate voltage to transistor 76 is negative. This, then, will not stress the B side of the amplifier. This circuitry makes the timing of the turn on signal not critical and it improves the reliability of the power amplifier.

Although the invention has been described in conjunction with a preferred embodiment, it is to be appreciated that various modifications may be made without departing from the spirit and scope of the invention as defined by the appended claims.

Having described a preferred embodiment of the invention, I claim:

1. An RF power amplifier system having amplifier protection, comprising:
   an RF source for providing an RF signal;
   a bridge circuit having an input circuit adapted for connection across a DC voltage source and an output circuit connected across a load, said bridge circuit including first and second transistor switching means for, when on, connecting said DC voltage source across said load for DC current flow therethrough in a first direction and third and fourth transistor switching means for, when on, connecting said DC voltage source across said load for DC current flow therethrough in a second direction;
   switch drive control means responsive to said RF signal for normally driving said transistor switching means on and off at a frequency dependent upon said RF signal and in such a manner that current from said DC source alternately flows in said first and second directions through said load;
   actuatable amplifier control means for, until actuated, applying a reverse bias to said second and fourth transistor switching means to prevent them from conducting current; and
   turn on signal means for providing a turn on signal for actuating said amplifier control means to remove said reverse bias from said second and fourth transistor switching means in such a manner that the reverse bias applied to said fourth transistor switching means is removed during a first half cycle of said RF signal when said fourth transistor switching means is off and that the reverse bias applied to said second transistor switching means is removed during a succeeding half cycle of said RF signal when said second transistor switching means is off.

2. A system as set forth in claim 1 wherein said turn on signal means includes means for synchronizing said turn on signal with said RF signal and for phase displacing said turn on signal therefrom so that said turn on signal occurs when said fourth transistor switching means is off such that said reverse bias to said fourth transistor means is removed when said fourth transistor means is off.

3. A system as set forth in claim 2 wherein said actuatable amplifier control means includes fifth transistor switching means for until actuated, applying a said reverse bias to said fourth transistor switching means and a sixth transistor switching means for, until actuated, applying a said reverse bias to said second transistor switching means, and means for applying said turn on signal to said fifth transistor switching means to actuate same to remove said reverse bias to said fourth transistor switching means.

4. A system as set forth in claim 3 including signal delay means for delaying application of said turn on signal to said sixth transistor switching means for a time duration sufficient that the application of said turn on signal to said sixth transistor switching means takes place when said second transistor switching means is off so that the reverse bias applied to said second transistor switching means is removed when said second transistor switching means is off.

5. A system as set forth in claim 4 wherein said delay means includes a phase delay circuit for delaying application of a said turn on signal.

6. A system as set forth in claim 5 wherein said phase delay circuit includes an LC circuit.

7. A system as set forth in claim 4 including a plurality of said bridge circuits each having a said load in the form of a primary winding on a transformer having a secondary winding, said secondary windings being connected together in series for additively combining the RF amplified signals appearing across each said load.

8. An RF power amplifier system having amplifier protection, comprising:
   a common RF driver for supplying a common RF drive signal;
   a plurality of actuatable RF power amplifiers for each providing an amplified RF signal, each said amplifier including a bridge circuit having a pair of terminals for connection across a DC voltage source and a pair of output terminals;

a like plurality of transformers each having a primary winding connected across a said pair of output terminals of an associated one of said RF amplifiers and a secondary winding, said secondary windings being connected together in series so as to additively combine the amplified RF signals;

each said bridge circuit including first and second transistor switching means connected together in series across said input terminals and having a first junction therebetween connected to one of said output terminals and third and fourth transistor switching means connected together in series across said input terminals and having a second junction therebetween connected to the other one of said output terminals;

drive circuit means responsive to said RF drive signal for driving said transistor switching means on and off at a frequency dependent upon said RF drive signal in such a manner that during a first half cycle of said RF drive signal the first and fourth transistor switching means are driven on for current flow in a first direction through said primary winding and that during a second half cycle of said RF signal the second and third transistor switching means are driven on for current flow in a second direction through said primary winding;

amplifier control circuitry for normally controlling said RF amplifier to be in an off condition by reverse biasing the second and fourth transistor switching means; and amplifier turn on control means for turning on said RF amplifier means by removing said reverse bias to said second and fourth transistor switching means in such a manner that the reverse bias on said second transistor switching means is removed during a first half cycle of said RF drive signal when said second transistor switching means is off and that the reverse bias on said fourth transistor switching means is removed during a second half cycle when said fourth switching transistor switching means is off.

9. A system as set forth in claim 8 wherein said amplifier control circuitry includes means responsive to a turn on signal for removing said reverse bias to said second and fourth transistor switching means.

10. A system as set forth in claim 9 wherein said amplifier turn on control means includes means for providing a said turn on signal.

11. A system as set forth in claim 10 wherein said turn on signal means includes means for synchronizing said turn on signal with said RF signal and for phase displacing said turn on signal therefrom so that said turn on signal occurs when said second transistor switching means is off such that said reverse bias to said second transistor means is removed when said second transistor means is off.

12. A system as set forth in claim 11 wherein said amplifier control circuitry includes fifth transistor switching means for, until actuated, applying a said reverse bias to said second transistor switching means and a sixth transistor switching means for, until actuated, applying a said reverse bias to said fourth transistor switching means, and means for applying said turn on signal to said fifth transistor switching means to actuate same to remove said reverse bias to said second transistor switching means.

13. A system as set forth in claim 12 including signal delay means for delaying application of said turn on signal to said sixth transistor switching means for a time duration sufficient that the application of said turn on signal to said sixth transistor switching means takes place when said fourth transistor switching means is off so that the reverse bias applied to said fourth transistor switching means is removed when said fourth transistor switching means is off.

14. A system as set forth in claim 13 wherein said delay means includes a phase delay circuit for delaying application of a said turn on signal.

15. A system as set forth in claim 14 wherein said phase delay circuit includes an LC circuit.

* * * * *